US010243157B2

(12) United States Patent
Kumagai et al.

(10) Patent No.: US 10,243,157 B2
(45) Date of Patent: Mar. 26, 2019

(54) THIN FILM TRANSISTOR ARRAY AND IMAGE DISPLAY DEVICE

(71) Applicant: TOPPAN PRINTING CO., LTD., Taito-ku (JP)

(72) Inventors: Minoru Kumagai, Taito-ku (JP); Noriaki Ikeda, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 302 days.

(21) Appl. No.: 15/080,924

(22) Filed: Mar. 25, 2016

(65) Prior Publication Data

US 2016/0285019 A1 Sep. 29, 2016

Related U.S. Application Data

(63) Continuation of application No. PCT/JP2014/004704, filed on Sep. 11, 2014.

(30) Foreign Application Priority Data

Sep. 25, 2013 (JP) .................................. 2013-198155

(51) Int. Cl.
*H01L 51/05* (2006.01)
*H01L 27/32* (2006.01)
(Continued)

(52) U.S. Cl.
CPC .......... *H01L 51/107* (2013.01); *G02F 1/1368* (2013.01); *G02F 1/167* (2013.01);
(Continued)

(58) Field of Classification Search
CPC . H01L 27/31; H01L 27/3241; H01L 27/3276; H01L 27/3297; H01L 27/3248; H01L 51/0545
See application file for complete search history.

(56) References Cited

U.S. PATENT DOCUMENTS

2007/0210311 A1 9/2007 Ando et al.
2007/0212807 A1* 9/2007 Yamada ................ H01L 51/102
438/99
(Continued)

FOREIGN PATENT DOCUMENTS

JP 2002-299442 A 10/2002
JP 2007-324510 A 12/2007
(Continued)

OTHER PUBLICATIONS

International Search Report dated Dec. 16, 2014 in PCT/JP2014/004704, filed Sep. 11, 2014.
(Continued)

*Primary Examiner* — Michele Fan

(74) *Attorney, Agent, or Firm* — Oblon, McClelland, Maier & Neustadt, L.L.P.

(57) ABSTRACT

A thin film transistor array includes a substrate, a gate electrode formed on the substrate, a gate insulation film covering the gate electrode, a source electrode formed on the gate insulation film, a drain electrode formed on the gate insulation film, a semiconductor layer connected to the source electrode and the drain electrode, an interlayer insulation film formed on the drain electrode and the semiconductor layer, and a pixel electrode formed on the interlayer insulation film. The interlayer insulation film has a via hole that reaches a portion of the drain electrode, and the drain electrode has a liquid repellent coating on the portion positioned in the via hole.

19 Claims, 5 Drawing Sheets

(51) Int. Cl.
- *H01L 51/10* (2006.01)
- *H01L 51/00* (2006.01)
- *H01L 27/12* (2006.01)
- *G02F 1/1368* (2006.01)
- *G02F 1/167* (2019.01)
- *H01L 27/28* (2006.01)

(52) U.S. Cl.
CPC ...... *H01L 27/1248* (2013.01); *H01L 27/1292* (2013.01); *H01L 27/283* (2013.01); *H01L 27/3248* (2013.01); *H01L 51/0004* (2013.01); *H01L 51/005* (2013.01); *H01L 51/0034* (2013.01); *H01L 51/0035* (2013.01); *H01L 51/0096* (2013.01); *H01L 51/0545* (2013.01); *H01L 51/0055* (2013.01); *H01L 51/0094* (2013.01)

(56) References Cited

U.S. PATENT DOCUMENTS

2009/0286361 A1* 11/2009 Kawashima ........ H01L 51/0005 438/149

2013/0056738 A1   3/2013 Ikeda et al.

FOREIGN PATENT DOCUMENTS

| | | |
|---|---|---|
| JP | 2010-003723 A | 1/2010 |
| JP | 2011-023445 A | 2/2011 |
| JP | 2011-191730 A | 9/2011 |
| JP | 2012-064844 A | 3/2012 |
| JP | 2012-204657   | 10/2012 |
| TW | 200735372 A   | 9/2007 |
| TW | 200744153 A   | 12/2007 |
| TW | 201142955 A1  | 12/2011 |

OTHER PUBLICATIONS

Combined Office Action and Search Report dated Nov. 8, 2017 in Taiwanese Patent Application No. 103132707 (with English language translation of Office Action and English translation of categories of cited documents).

Office Action dated Apr. 9, 2018 in Taiwanese Patent Application No. 103132707 (with English language translation) citing reference AO therein, 6 pages.

* cited by examiner

R-R' CROSS SECTION

R-R' CROSS SECTION

A-A' CROSS SECTION

R-R' CROSS SECTION

THIN FILM TRANSISTOR ARRAY AND IMAGE DISPLAY DEVICE

CROSS-REFERENCE TO RELATED APPLICATIONS

The present application is a continuation of International Application No. PCT/JP2014/004704, filed Sep. 11, 2014, which is based upon and claims the benefits of priority to Japanese Application No. 2013-198155, filed Sep. 25, 2013. The entire contents of these applications are incorporated herein by reference.

BACKGROUND OF THE INVENTION

Field of the Invention

The present invention relates to a thin film transistor array and an image display device.

Discussion of the Background

In recent years, considering achieving flexibility, light weight and low cost, research for a thin film transistor using an organic semiconductor which is capable of being manufactured by a printing method has been actively conducted. It is expected that the research into thin film transistor will be applied to a drive circuit of an organic EL, an electronic paper or the like, or an electronic tag.

The thin film transistor is produced by laminating a conductor, an insulator and a semiconductor or the like. Regarding a thin film transistor array, an interlayer insulation film is provided depending on a structure and a usage thereof, and an upper conductor and a lower conductor are electrically connected via holes disposed in the interlayer insulation film.

To form the interlayer insulation film, the following method is widely used. An inorganic film made of a silicon nitride or a silicon oxide is formed by plasma CVD and a desired opening portion is formed using a photo resist, and then via holes are formed by dry etching. A photo sensitive resin can also be used to form this film. According to these methods, since photolithography is used to form via holes, there is a concern for the productivity and the manufacturing cost, when comparing with an attempt for manufacturing a thin film transistor array by a printing method which aims at cost reduction.

Meanwhile, PTL1 describes a method of forming an interlayer insulation film by using a printing method. In this method, after forming a gate insulation film, a solvent is applied to a portion where via holes will be formed with an ink jet method to dissolve the insulation film, thereby forming via holes. By using an ink jet method, a liquid-repellent ink is coated on a conductor surface exposed in the via hole portion so as to obtain liquid-repellent properties. Subsequently, a precursor resin is printed on the entire surface of the substrate with an ink jet method, followed by curing so as to form the interlayer insulation film.

According to the method described in PTL2, after forming a gate insulation film, a solvent is applied to a portion where via holes will be formed with an ink jet method to dissolve the insulation film, thereby forming via holes. Since the area of a conductor exposed in the via hole portion is smaller than the opening portion, by using an ink jet method, a liquid-repellent ink is coated on a surface of the conductor so as to obtain liquid-repellent properties. Then, a precursor resin is printed on the entire surface of the substrate with an ink jet method, followed by curing so as to form the interlayer insulation film.

PTL 1: JP-A-2012-064844
PTL 2: JP-A-2012-204657

SUMMARY OF THE INVENTION

According to one aspect of the present invention, a thin film transistor array includes a substrate, a gate electrode formed on the substrate, a gate insulation film covering the gate electrode, a source electrode formed on the gate insulation film, a drain electrode formed on the gate insulation film, a semiconductor layer connected to the source electrode and the drain electrode, an interlayer insulation film formed on the drain electrode and the semiconductor layer, and a pixel electrode formed on the interlayer insulation film. The interlayer insulation film has a via hole that reaches a portion of the drain electrode, and the drain electrode has a liquid repellent coating on the portion positioned in the via hole.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
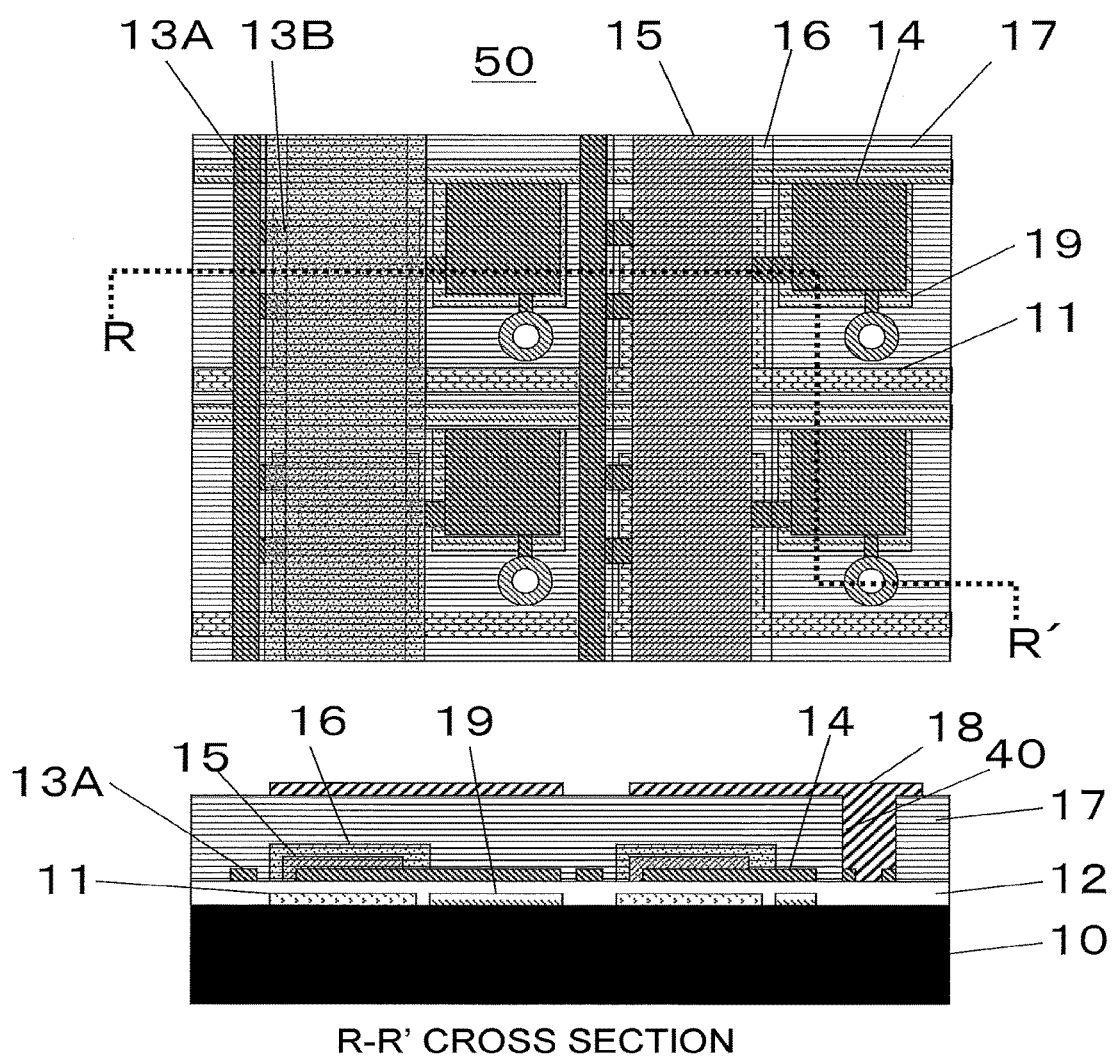
FIG. 1 is a plan view and a cross sectional view showing a structure of a thin film transistor array according to embodiments of the present invention.

With reference to the drawings, some embodiments of the present invention will be described. It should be noted that the scale is not accurately indicated in the drawings in order to have the explanation easily be understandable. In the embodiments, the same reference symbols are applied to the same elements.

Thin film transistor arrays 50 and 51 according to the present embodiment are provided with at least an insulation substrate 10, a gate electrode 11, a gate insulation film 12, a source electrode 13B, a drain electrode 14, a semiconductor layer 15, a protective layer 16 that covers the semiconductor layer 15, a pixel electrode 18, an interlayer insulation film 17 formed between the drain electrode 14 and the pixel electrode 18. The gate electrode 11 is covered with the gate insulation film 12. The interlayer insulation film 17 is an organic film or a mixed film made of an organic material and an inorganic material. In order to connect the pixel electrode 18 to the drain electrode 14, the interlayer insulation film 17 includes a via hole 40 at a part of a portion where the drain electrode 14 is formed. The via hole 40 is filled with a conductive material. The drain electrode 14 includes an opening portion in which an opening is formed at an electrode material, the opening portion being located in the via hole 40. The drain electrode 14 in the via hole 40 is provided with a thiol group or a disulfide group contained thereon. For example, an opening edge of the via hole 40 is present on the edge of the drain electrode 14 or on the drain electrode 14. For example, the thickness of the interlayer insulation film 17 ranges from 0.5 μm to 5 μm inclusive. For example, the interlayer insulation film 17 is formed with an ink jet printing method, a screen printing method or a gravure offset printing method. For example, the semiconductor layer 15 is an organic semiconductor layer. For example, the insulation substrate 10 is a plastic substrate.

The image display device according to the present embodiment is provided with thin film transistor arrays 50 and 51 according to the present embodiment and an image display medium (e.g., image display panel). For example, an electrophoresis method is applied to the image display medium.

When manufacturing the thin film transistors 50 and 51, an opening is formed in advance, at a portion in the drain electrode 14 where a via hole will be formed, and a liquid-repellent ink is applied thereto with an ink jet method. The film of the liquid-repellent ink is formed only at a drain electrode 14 of a portion where the via hole will be formed. Thus, only a desired portion on the drain electrode 14 has liquid-repellent properties so that the interlayer insulation film 17 is selectively excluded from being formed by the printing method on a portion of the drain electrode 14 where the via hole will be formed.

As a result, the via hole 40 can be formed at the interlayer insulation film 17 by the printing method.

In more detail, FIG. 1 shows an example of a configuration of the thin film transistor array 50 according to the embodiment of the present invention. In FIG. 1, a plan view is illustrated in the upper side and a cross sectional view is shown in the lower side. The same applies to FIGS. 2 and 5.

The thin film transistor array 50 includes, on the plastic substrate 10 (insulation substrate), the gate electrode 11, the capacitor electrode 19, the gate insulation film 12, the source electrode 13B, the drain electrode 14, the semiconductor layer 15, the protective layer 16, the interlayer insulation film 17 and the pixel electrode 18 (upper pixel electrode). The source electrode 13B and the drain electrode 14 are formed on the gate insulation film 12 and connected to the semiconductor layer 15. In the thin film transistor array 50, the protective layer 16 is made of an organic insulation material, and formed in a stripe shape to cover the respective semiconductor layers 15. Moreover, in the via hole 40 formed through the interlayer insulation film 17 so as to conduct between the pixel electrode 18 and the drain electrode 14, an opening edge (lower edge of the via hole 40 as shown at lower section in FIG. 1) is disposed on an edge of the drain electrode 14 or on the drain electrode 14.

Material that can be used for the plastic substrate 10 according to the embodiment of the present invention include polymethylene methacrylate, polyacrylate, polycarbonate, polystyrene, polyethylene sulfide, polyethersulfone, polyolefin, polyethylene terephthalate, polyethylene naphthalate, cycloolefin polymer, polyether sulfone, triacetylcellulose, polyvinyl fluoride film, ethylene-tetrafluoroethylene, copolymer resin, weather resistant polyethylene-terephthalate, weather resistant polypropylene, glass fiber reinforced acrylic resin film, glass fiber reinforced polycarbonate, transparent polyimide, fluorine-based resin, cyclic polyolefin resin, and the like. However, the present invention is not limited to these materials. These materials can be used singly, or used as a composite substrate where two or more materials are laminated. A substrate in which a resin layer such as color filter is provided on a glass or a plastic substrate can be used as well.

As materials used for the gate electrode 11, the source wiring 13A, the source electrode 13B, the drain electrode 14, the pixel electrode 18 and the capacitor electrode 19 according to the embodiments of the present invention, low resistance metal materials such as Au, Ag, Cu, Cr, Al, Mg and Li, or an oxide materials can be used. Specifically, indium oxide ($In_2O_3$), tin oxide ($SnO_2$), zinc oxide (ZnO), cadmium oxide (CdO), indium oxide cadmium ($CdIn_2O_4$), cadmium tin oxide ($Cd_2SnO_4$), zinc tin oxide ($Zn_2SnO_4$), zinc indium oxide (InZnO) or the like can be used. Also, materials in which impurities are doped into the oxide material can preferably be used. For example, a material in which molybdenum or titanium are doped into indium oxide, a material in which antimony or fluorine are doped, a material in which indium, aluminum and gallium are doped, or the like can be used. In these materials, indium tin oxide (ITO) in which tin is doped into indium oxide shows significant low resistivity. Moreover, organic conductive materials such as PEDOT (polyethylenedioxythiophene) can preferably be used. In this case, organic conductive material may be used singly or a material having plurality of layers may be used in which organic conductive materials and conductive oxide materials are laminated. The gate electrode 11, the source wiring 13A, the source electrode 13B and the drain electrode 14, the pixel electrode 18 and the capacitor electrode 19 may be formed by the same material or formed by different materials. To reduce manufacturing steps, the same material is preferably used for the source wiring 13A, the source electrode 13B and the drain electrode 14. These electrodes are formed with a vacuum deposition method, an ion plating method, a sputtering method, a laser ablation method, a plasma CVD method, an optical CVD method, a hot wire CVD method or the like. These electrodes can be formed by coating the above-described conductive material which is in the form of an ink or a paste, with screen printing, flexographic printing, or an ink jet method, followed by firing. Methods of forming these electrodes are not limited to these methods.

For the material of the gate insulation film 12 according to the embodiments of the present invention, inorganic materials such as silicon oxide, silicon nitride, silicon oxynitride, aluminum oxide, tantalum oxide, yttrium oxide, hafnium oxide, hafnium aluminate, zirconium oxide, titanium oxide or the like, or polyacrylates such as PMMA (polymethyl methacrylate), or PVA (polyvinyl alcohol), PVP (polyvinyl phenol) or the like can be used. To simply form the gate insulation film 12 and a concave portion, a coating type insulation material having photo sensitivity is preferably used. However, the present invention is not limited to these materials. To reduce a gate leak current, the preferable resistivity of the insulation material is $10^{11}$ Ωcm or more, and more preferably $10^{14}$ Ωcm or more.

Organic semiconductor materials that can be used for the semiconductor layer 15 according to the present embodiment of the present invention include: high molecular weight organic semiconductor materials, such as, polythiophene, polyallylamine, fluorene bithiophene copolymer and derivatives thereof; and low molecular weight organic semiconductor materials such as pentacene, tetracene, copper phthalocyanine, perylene, 6,13-Bis (triisopropylsilylethynyl) pentacene (TIPS-pentacene) and derivatives thereof. Also, a precursor which will be converted to an organic semiconductor by a heat treatment can be used as a semiconductor material ink. Also, carbon compounds such as carbon nano-tubes or fullerene, or semiconductor nano particle dispersions or the like can be used as a material of the semiconductor layer. In the case where the semiconductor material ink is used, solvents that can be used include, but not limited to, toluene, xylene, indane, tetralin, propylene glycol methyl ether acetate or the like can be used.

As a material of the protective layer 16 according to the embodiment of the present invention, a polymer solution of polyvinyl phenol, polymethylmethacrylate, polyimide, polyvinyl alcohol, epoxy resin, fluororesin or the like, or a solution in which particles such as alumina or silica gel are dispersed can preferably be used. As a forming method of the protective layer 16, a method in which pattern is directly formed can preferably be used, by using screen printing, flexographic printing or a wet method such as an ink jet method.

Compounds contained in the liquid-repellent ink used in the embodiments of the present invention include, but not limited to, thiol compound, disulphide compounds, silane coupling agents and phosphonic acid compounds. These compounds include, but not limited to, alkanethiol compounds such as ethanethiol, propanethiol, butanthiol, pentathiol, hexanethiol, heptanethiol, octanethiol, decanethiol, octadecanethiol or the like, aromatic thiol compounds such as benzenethiol, fluorobenzenethiol, pentafluorobenzenethiol or the like, disulphide compounds such as diphenyl disulfide, silane coupling agents such as methyl trimethoxysilane, ethyl trimethoxysilane, propyl trimethoxysilane, octyl trimethoxysilane, octyl triethoxysilane, octyl trichlorosilane, octadecyl trimethoxysilane, octadecyl triethoxysilane, octadecyl trichlorosilane or the like, or phosphonic acid compound such as octadecyl phosphonic acid can be used. For the solvent, alcohol based solvent can be used, including, but not limited to, 1-propanol, 1-butanol, 2-butanol, 3-pentanol, 2-methyl-1-butanol, 2-methyl-2-butanol, isoamyl alcohol, 3-methyl-2-butanol, 4-methyl-2-pentanol, allyl alcohol, propylene glycolmonomethyl ether and propylene glycolmonoethyl ether.

Material that can be used for the interlayer insulation film 17 according to the embodiments of the present invention include polyimide, polyamide, polyester, polyvinyl phenol, polyvinyl alcohol, polyvinyl acetate, polyurethane, polysulfone, polyvinylidene fluoride, cyanoethyl pullulan, epoxy resin, phenol resin, benzocyclobutene resin, acrylic resin, polystyrene, polycarbonate, cyclic polyolefin, fluororesin, silicone resin, and polymer alloys or copolymers of these resins. Also, composite materials including organic or inorganic filler can be used, but not limited to these materials.

The structure of a thin film transistor which is formed by using a pattern forming method is not specifically limited. Either a top gate type or a bottom gate type may be used. Difference in structures other than the difference in the arrangement of the gate electrode 11, may be the difference in the location of the semiconductor layer 15 as between a bottom contact type or a top contact type. However, in the case where an organic semiconductor material is used as a semiconductor layer 15, a bottom contact type structure is preferably used. This is because, for the bottom contact type structure, the channel length can be designed to be shorter compared with that of the top contact type structure so that a large amount of drain current can be obtained.

EXAMPLE 1

Figure 2:
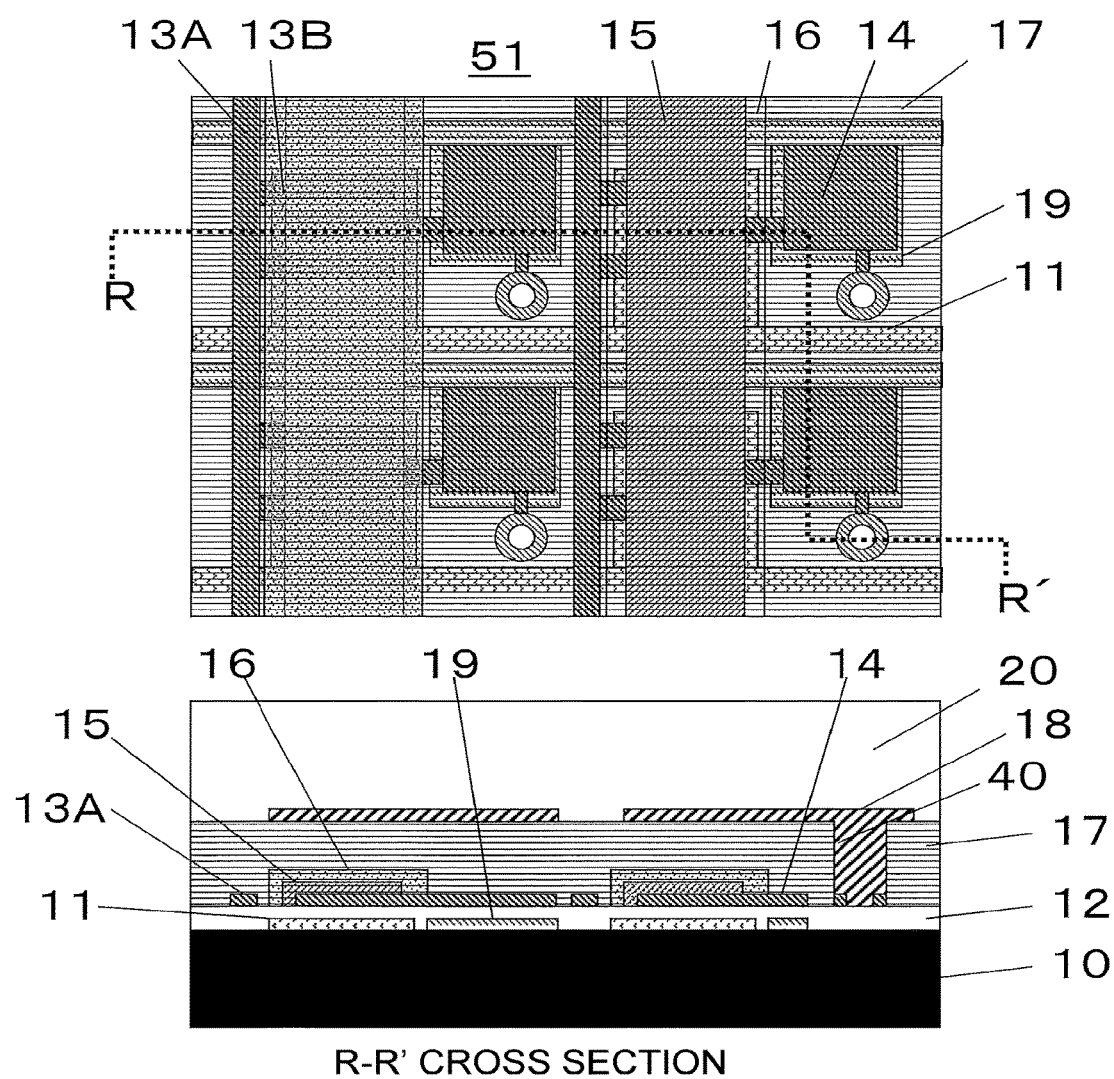
FIG. 2 is a plan view and a cross sectional view showing a structure of a thin film transistor array according to an example 1.

FIG. 2 is a pattern layout plan view and a cross sectional view showing an overall configuration of a thin film transistor array 51 including a bottom gate bottom contact type flexible thin film transistor array according to an example 1. With reference to FIG. 2, hereinafter, a manufacturing method will be described. The thin film transistor array 51 includes 240×320 elements each having a dimension 300 μm×300 μm.

As a plastic substrate 10, polyethylene naphthalate (PEN) film was used. Aluminum was film-formed on the PEN film at a thickness of 100 nm with sputtering method, followed by performing photolithography using positive resist and etching. Thereafter, the resist was removed so as to form the gate electrode 11 and the capacitor electrode 19.

Subsequently, as a gate insulation material, coating type photosensitive insulation material (AH series, manufactured by Hitachi Chemical Co., LTD) was applied by spin coating. Thereafter, an opening was formed by photolithography at a terminal portion of the gate wiring which is not shown, followed by drying at 180 deg. C., whereby the gate insulation film 12 was obtained.

Next, gold film was formed with a thickness of 50 nm by a vapor deposition method, followed by performing photolithography using positive resist and etching. Thereafter, the resist was removed so as to form the source electrode 13B and the drain electrode 14.

As a semiconductor layer forming material, a solution in which tetralin and 6, 13-Bis(triisopropylsilyethynyl) pentacene (TIPS-pentacene) were mixed was used. To form the semiconductor layer, flexography method was used. For the flexography, photo sensitive resin flexographic-plate and a 150 line anilox roll were used to form a stripe-shaped semiconductor layer having a width of 100 μm. After printing, drying was applied for 60 minutes at 100 deg. C. so as to form the semiconductor layer 15.

Subsequently, the protective layer 16 was formed. Specifically, fluorine-based resin was used for a material to form a protective layer. A flexography method was used to form the protective layer. As a flexographic plate, a photo sensitive resin flexographic-plate was used and an anilox roll of 150 lines was used. A stripe-shaped protective layer 16 having a line width 150 μm was printed by using a stripe-shaped flexographic plate to cover the semiconductor layer 15, followed by drying for 90 minutes at 100 deg. C., thereby forming the protective layer 16.

Figure 3:
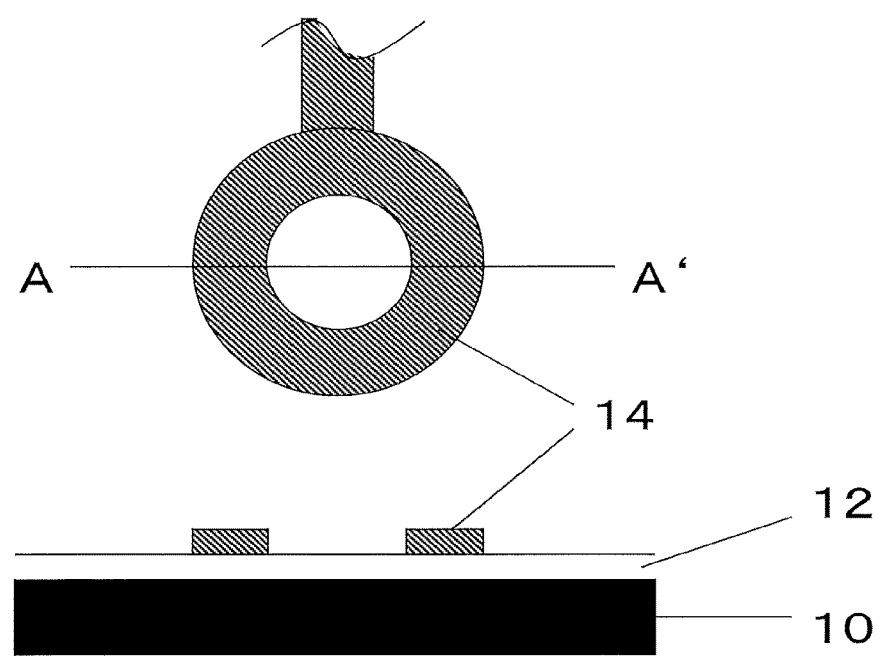
FIG. 3 is a plan view and a cross sectional view showing a drain electrode according to the example 1.
Figure 4:
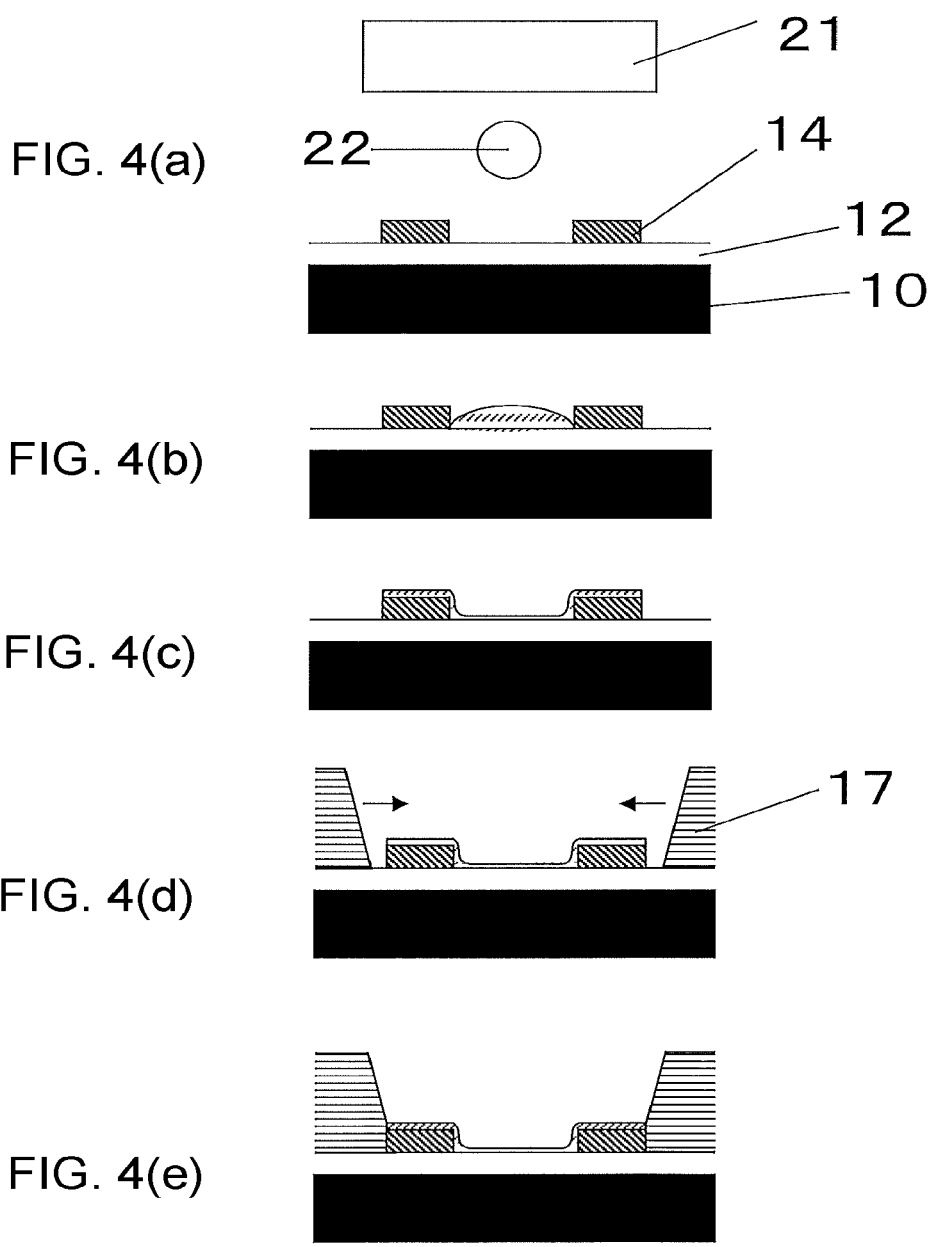
FIGS. 4(a)-4(e) are a set of cross sectional views showing manufacturing processes from a liquid-repellent treatment up to a formation of an interlayer insulation film, in course of manufacturing the thin film transistor array according to the example 1.

A liquid-repellent treatment was performed at a portion of the drain electrode at which a via hole 40 was going to be formed. FIG. 3 shows a shape and a cross section of the drain electrode 14 at a portion (via hole formation portion) where the via hole 40 will be formed in the post-process. The drain electrode 14 has an opening portion at a position of the via hole formation portion. The opening portion has an opening at the center portion thereof. FIG. 4 shows cross-sectional shapes of the drain electrode 14 at the via hole formation portion, covering from the liquid-repellent treatment to the formation of the interlayer insulation film 17.

As shown in FIG. 4 (a), an ink jet printing is performed such that a liquid-repellent treatment ink 22 discharged from an ink jet head 21 is applied to the drain electrode 14 at the via hole formation portion. The liquid-repellent treatment ink 22 contains a thiol compound or a disulphide compound. For a solvent, an alcohol solvent having high boiling point can preferably be used. The sulfur atoms in the thiol compound or disulphide compound promptly chemically combine with metal atoms in the drain electrode 14. Hence, the drain electrode 14 at the via hole formation portion can readily be imparted with repellent properties. In the case where the thiol compound or the disulphide compound has a fluorinated alkyl chain, repellent properties will be increased.

FIG. 4 (b) shows a state where the liquid-repellent treatment ink 22 discharged from the ink jet head 21 has impacted inside the drain electrode 14 at the via hole formation portion. The surface of the gate insulation film 12 formed by the photo sensitive resin has liquid-repellent properties. Hence, the impacted liquid-repellent treatment ink 22 is temporarily pooled in the opening of the drain electrode 14. However, as shown in FIG. 4 (c), the liquid-repellent treatment ink 22 rapidly wet-spreads on the drain electrode 14 which has wettability relatively higher than that of the gate insulation film 12. By adjusting the diameter of the drain electrode 14 and an amount of application of the liquid-repellent treatment ink 22, the liquid-repellent treatment ink 22 can be printed only on the drain electrode 14 at the via hole formation portion.

Subsequently, the interlayer insulation film 17 was formed. As a material for forming the interlayer insulation film, an epoxy resin was used. Screen printing was used for the formation, followed by drying for one hour at 90 deg. C. so as to form the interlayer insulation film 17. The interlayer insulation film 17 was printed so as to entirely cover the thin film transistor array 51. As shown in FIG. 4 (d), the printing was performed such that the opening thereof was wider than that of the drain electrode 14 at the via hole formation portion.

The ink flows when the ink used for forming the interlayer insulation film is printed on a substrate. However, since the surface of the drain electrode 14 at the via hole formation portion has liquid-repellent properties, as shown in FIG. 4 (e), the ink of the interlayer insulation film is stopped from flowing at the edge section of the drain electrode 14. Accordingly, the via hole 40 can be provided in the outer periphery of the drain electrode 14 at the via hole formation portion.

Subsequently, the pixel electrode 18 was formed. As a material for forming the pixel electrode, a silver paste was used. To form the pixel electrode 18, screen printing was used such that the silver paste was completely filled in the via hole 40. After forming the pattern, drying was applied for one hour at 90 deg. C., thereby forming the pixel electrode 18.

Thereafter, the display device according to the present example was driven with an electrophoretic medium 20 sandwiched between a counter electrode and the pixel electrode. Even though the interlayer insulation film 17 was formed by a printing method, conduction between the pixel electrode 18 and the drain electrode 14 can be kept favorable. As a result, excellent image display operation was performed.

COMPARATIVE EXAMPLE 1

Figure 5:
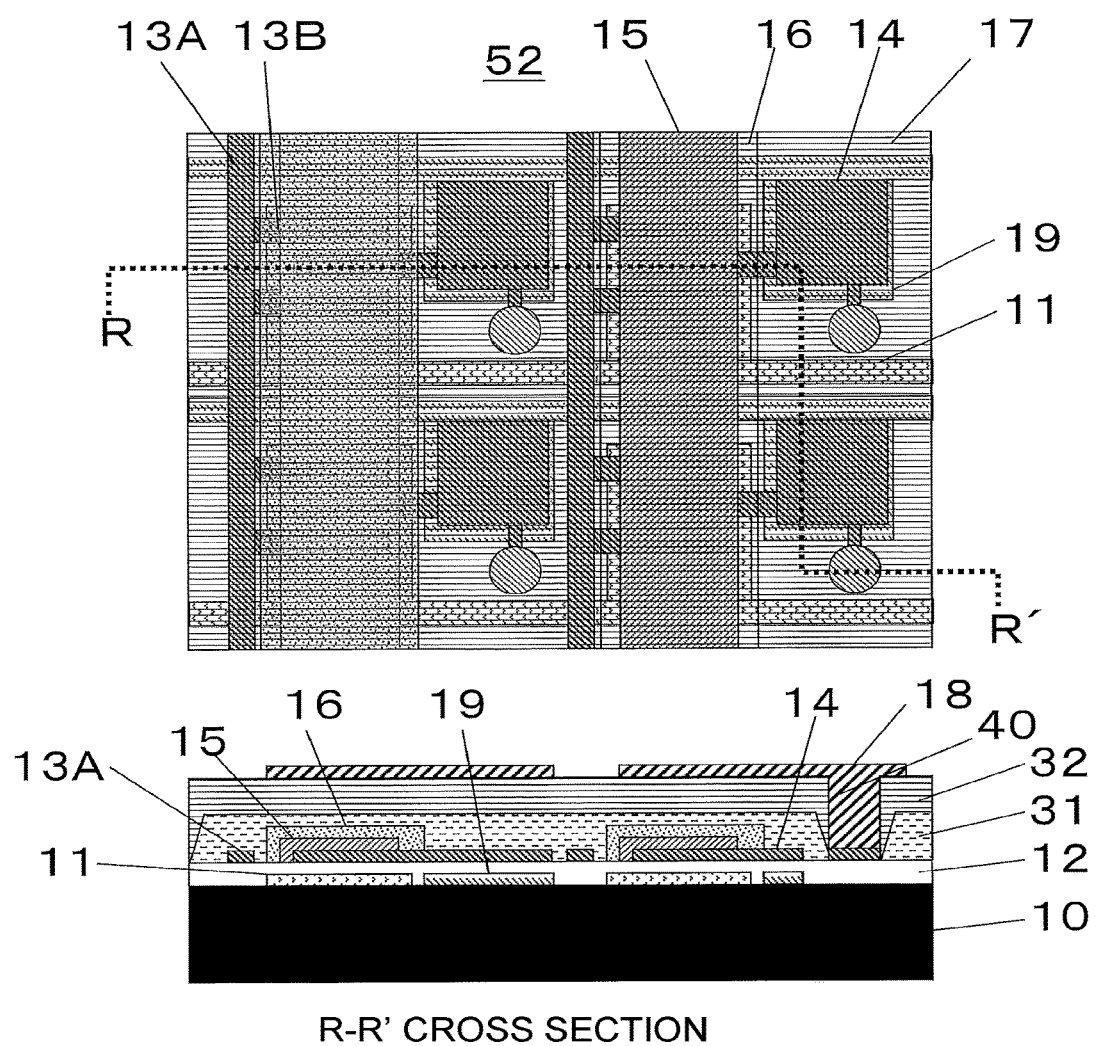
FIG. 5 is a plan view and a cross sectional view showing a structure of a thin film transistor array according to a comparative example 1.

As a comparative example 1, a manufacturing method of a bottom gate bottom contact type flexible thin film transistor array 52 as shown in FIG. 5 will be described. This transistor array has a dimension of 300 µm×300 µm per one element and includes 240×320 elements.

The polyethylene naphthalate (PEN) film was used as a plastic substrate 10, and similar to the example 1, the gate electrode 11, the capacitor electrode 19, the gate insulation film 12, the source electrode 13, the drain electrode 14, the semiconductor layer 15 and the protective layer 16 were formed.

The interlayer insulation film 17 was replaced by a two-layered configuration including a first interlayer insulation film 31 and a second interlayer insulation film 32. The material and printing method which were same as those of the example 1 were used for both the interlayer insulation films 31 and 32. However, the first interlayer insulation film 31 was formed to have a thickness of 0.5 µm on the entire substrate. Droplet of γ-butyrolactone with an amount of approximately 25 pL were dropped onto the via hole portion for three times. Next, in order to impart the drain electrode 14 of the via hole portion with repellent properties, similar to the example 1, the liquid-repellent treatment ink 22 was applied thereto with the ink jet printing. Subsequently, the second interlayer insulation film 32 was formed with a thickness of 2.5 µm.

Similar to the example 1, the pixel electrode 18 was formed and the display device according to the comparative example 1 was driven with an electrophoretic medium 20 sandwiched between a counter electrode and the pixel electrode. As a result, conduction was blocked between the pixel electrode 18 and the drain electrode 14 in a portion where the drilling was insufficient at the via hole portion in the interlayer insulation film 17 and favorable display was not achieved due to the large amount of unit defects.

As described, according to an aspect of the present invention, without using photolithography to form an interlayer insulation film, a thin film transistor array and an image display device can be provided, having fewer defects in the interlayer insulation film thereof.

According to the method described in PTL 1, after the first interlayer insulation film is formed, the solvent is applied to form the via holes. Hence, a residue of the first interlayer insulation film is likely to remain in the via hole portion, causing a problem in which the conduction between the pixel electrode and the drain electrode is insufficient.

Also, according to the method described in PTL 2, the drain electrode of the via hole portion is formed, in advance, to be smaller than a size of the via hole of the first interlayer insulation film. However, vacuum film forming and photolithography are used to form the drain electrode. Accordingly, considering achieving productivity and cost reduction, the problems are serious compared with the printing method.

The present invention is achieved in light of the above-mentioned problems and has an aspect that can provide a thin film transistor array and an image display device, in which the interlayer insulation film is formed without using photolithography to have fewer defects. With respect to a structure of a via hole concerning the above-mentioned problems, an aspect of the present invention provides a structure and a method capable of forming an interlayer insulation film by using a printing method, in which an opening is formed in advance at a drain electrode portion and a liquid-repellent ink is applied thereto with an ink jet method, whereby liquid-repellent properties are given to only the via hole portion at the drain electrode.

The thin film transistor array according to one aspect of the present invention at least includes: an insulation substrate; a gate electrode; a gate insulation film; a source electrode; a drain electrode; a semiconductor layer; a protective layer that convers the semiconductor layer; a pixel electrode; and an interlayer insulation film formed between the drain electrode and the pixel electrode. The interlayer insulation film is an organic film or a mixed film made of an organic material and an inorganic material, including a via hole at a part of a portion where the drain electrode is formed so as to connect the pixel electrode to the drain electrode. The drain electrode includes an opening portion in which an opening is formed in an electrode material, the opening portion being located in the via hole. The drain electrode in the via hole is provided with a thiol group or a disulfide group contained thereon.

In the above-described thin film transistor array, the opening end of the via hole may be present on an edge of the drain electrode or on the drain electrode.

In the above-described thin film transistor array, a thickness of the interlayer insulation film may range from 0.5 µm to 5 µm.

In the above-described thin film transistor array, the interlayer insulation film may be formed by an ink jet printing method, a screen printing method or a gravure offset printing method.

In the above-described thin film transistor array, the semiconductor layer may be an organic semiconductor layer.

In the above-described thin film transistor array, the insulation substrate may be a plastic substrate.

An image display device according to one aspect of the present invention includes the above-described thin film transistor array and an image display medium.

In the image display device, an electrophoresis method is applied to the image display medium.

According to an aspect of the present invention, a thin film transistor array and an image display device can be provided, in which the interlayer insulation film is formed without using photolithography to have fewer defects.

The flexible thin film transistor according to an aspect of the present invention can be utilized as a switching element of a flexible electronic paper or a flexible organic EL display or the like. Further, in one aspect, the present invention can be adapted to the manufacturing method thereof, thereby contributing an enhancement of the productivity. Specifically, forming the interlayer insulation film with a printing method, even a large scale thin film transistor can be produced with short tact time. Also, since the resin used for forming the interlayer insulation film is not applied to the drain electrode at the via hole portion, conduction between the drain electrode and the pixel electrode can be sufficiently secured. Thus, flexible thin film transistors applicable to wide range of products such as flexible display devices, IC cards and IC tags and the like can be produced with high quality and low cost.

REFERENCE SIGNS LIST

10: plastic substrate
11: gate electrode
12: gate insulation film
13A: source electrode
13B: source electrode
14: drain electrode
15: semiconductor layer
16: protective layer
17: interlayer insulation film
18: pixel electrode
19: capacitor electrode
20: electrophoretic medium
21: ink jet head
22: liquid-repellent ink
31: first interlayer insulation film
32: second interlayer insulation film
40: via hole
50: thin film transistor array
51: thin film transistor array
52: thin film transistor array Obviously, numerous modifications and variations of the present invention are possible in light of the above teachings. It is therefore to be understood that within the scope of the appended claims, the invention may be practiced otherwise than as specifically described herein.

What is claimed is:

1. A thin film transistor array, comprising:
a substrate;
a gate electrode formed on the substrate;
a gate insulation film covering the gate electrode;
a source electrode formed on the gate insulation film;
a drain electrode formed on the gate insulation film;
a semiconductor layer connected to the source electrode and the drain electrode;
an interlayer insulation film formed on the drain electrode and the semiconductor layer; and
a pixel electrode formed on the interlayer insulation film,
wherein the interlayer insulation film has a via hole that reaches a portion of the drain electrode, and the drain electrode has a liquid repellent coating on the portion positioned in the via hole,
wherein the drain electrode has an opening in the portion positioned in the via hole and the opening exposes a top surface of the gate insulation film.

2. The thin film transistor array of claim 1, wherein the liquid repellent coating comprises a material having a thiol group or a disulfide group.

3. The thin film transistor array of claim 2, wherein the liquid repellent coating comprises at least one compound selected from the group consisting of ethanethiol, propanethiol, butanthiol, pentathiol, hexanethiol, heptanethiol, octanethiol, decanethiol, octadecanethiol, benzenethiol, fluorotenzenethiol, and pentafluorobenzenethiol.

4. The thin film transistor allay of claim 3, wherein the interlayer insulation film comprises at least one selected from the group consisting of polyimide, polyamide, polyester, polyvinyl phenol, polyvinyl alcohol, polyvinyl acetate, polyurethane, polysulfone, polyvinylidene fluoride, cyanoethyl pullulan, epoxy resin, phenol resin, benzocyclobutene resin, acrylic resin, polystyrene, polycarbonate, cyclic polyolefin, fluororesin, and silicone resin.

5. The thin film transistor array of claim 2, wherein the liquid repellent coating comprises diphenyl disulfide.

6. The thin film transistor arrays of claim 5, wherein the interlayer insulation film comprises at least one selected from the group consisting of polyimide, polyimide, polyester, polyvinyl phenol, polyvinyl alcohol, polyvinyl acetate, polyurethane, polysulfone, polyvinylidene fluoride, cyanoethyl pullulan, epoxy resin, phenol resin, benzocyclobutene resin, acrylic resin, polystyrene, polycarbonate, cyclic polyolefin, fluororesin, and silicone resin.

7. The thin film transistor array of claim 1, wherein the interlayer insulation film is an organic film or a mixed film comprising an organic material and an inorganic material.

8. The thin film transistor array of claim 7, further comprising:
a protective layer that covers the semiconductor layer.

9. An image display device, comprising:
the thin film transistor array of claim 7; and
an image display medium.

10. The image display device of claim 9, wherein the image display medium is an electrophoretic display medium.

11. The thin film transistor array of claim 1, wherein the via hole is formed such that a side wall of the via hole is positioned at an edge portion of the drain electrode.

12. The thin film transistor array of claim 1, wherein the via hole is formed such that a side wall of the via hole is positioned on a surface of the drain electrode.

13. The thin film transistor array of claim 1, wherein the interlayer insulation film has a thickness of from 0.5 μm to 5 μm.

14. The thin film transistor array of claim 1, wherein the interlayer insulation film is formed by an ink jet printing method, a screen printing method or a gravure offset printing method.

15. The thin film transistor array of claim 1, wherein the semiconductor layer is an organic semiconductor layer.

16. The thin film transistor array of claim 1, wherein the substrate comprises a resin material.

17. The thin film transistor array of claim 1, wherein the interlayer insulation film comprises at least one selected from the group consisting of polyimide, polyamide, polyester, polyvinyl phenol, polyvinyl alcohol, polyvinyl acetate, polyurethane, polysulfone, polyvinylidene fluoride, cyanoethyl pullulan, epoxy resin, phenol resin, benzocyclobutene resin, acrylic resin, polystyrene, polycarbonate, cyclic polyolefin, fluororesin, and silicone resin.

18. An image display device, comprising:
the thin film transistor array of claim 1; and
an image display medium.

19. The image display device of claim 18, wherein the image display medium is an electrophoretic display medium.

\* \* \* \* \*